United States Patent [19]

Oppedahl

[11] Patent Number: 5,500,861
[45] Date of Patent: Mar. 19, 1996

[54] SCANNING, CIRCUITS, SYSTEMS AND METHODS

[75] Inventor: Douglas A. Oppedahl, Garland, Tex.

[73] Assignee: Convex Computer Corporation, Richardson, Tex.

[21] Appl. No.: 188,154

[22] Filed: Jan. 27, 1994

[51] Int. Cl.⁶ .................................. G06F 11/00
[52] U.S. Cl. .................................. 371/22.3
[58] Field of Search ............... 371/22.3, 22.5, 371/22.6, 22.1

[56] References Cited

U.S. PATENT DOCUMENTS

| | | | |
|---|---|---|---|
| 5,349,587 | 9/1994 | Nadeau-Dostie et al. | 371/22.3 |
| 5,448,575 | 9/1995 | Hashizume | 371/22.3 |

*Primary Examiner*—Vincent P. Canney
*Attorney, Agent, or Firm*—Fulbright & Jaworski

[57] ABSTRACT

Scanning circuitry 300 is provided which includes first input circuitry 302 which is operable to transfer bits of received data in response to a first clock signal. Second input circuitry 303 is also provided which is operable to transfer the bits of received data in response to a second clock signal. At least one first storage device 307 is provided which is operable to transfer bits of data received from the first input circuitry 302 in response to the first clock signal. At least one second storage device 308 is provided which is operable to transfer bits of data received from the second input circuitry 303 in response to the second clock signal. First output circuitry 309 is provided which is operable to transfer bits of data received from the at least one first storage device 307 in response to the second clock signal. Further, second output circuitry 310 is provided which shifts bits of data received from the at least one second storage device 308 in response to the second clock signal. A multiplexer 311 selects between bits of data received from the first output circuitry 309 and bits of data received from second output circuitry 310 in response to respective first and second states of a control signal.

30 Claims, 2 Drawing Sheets

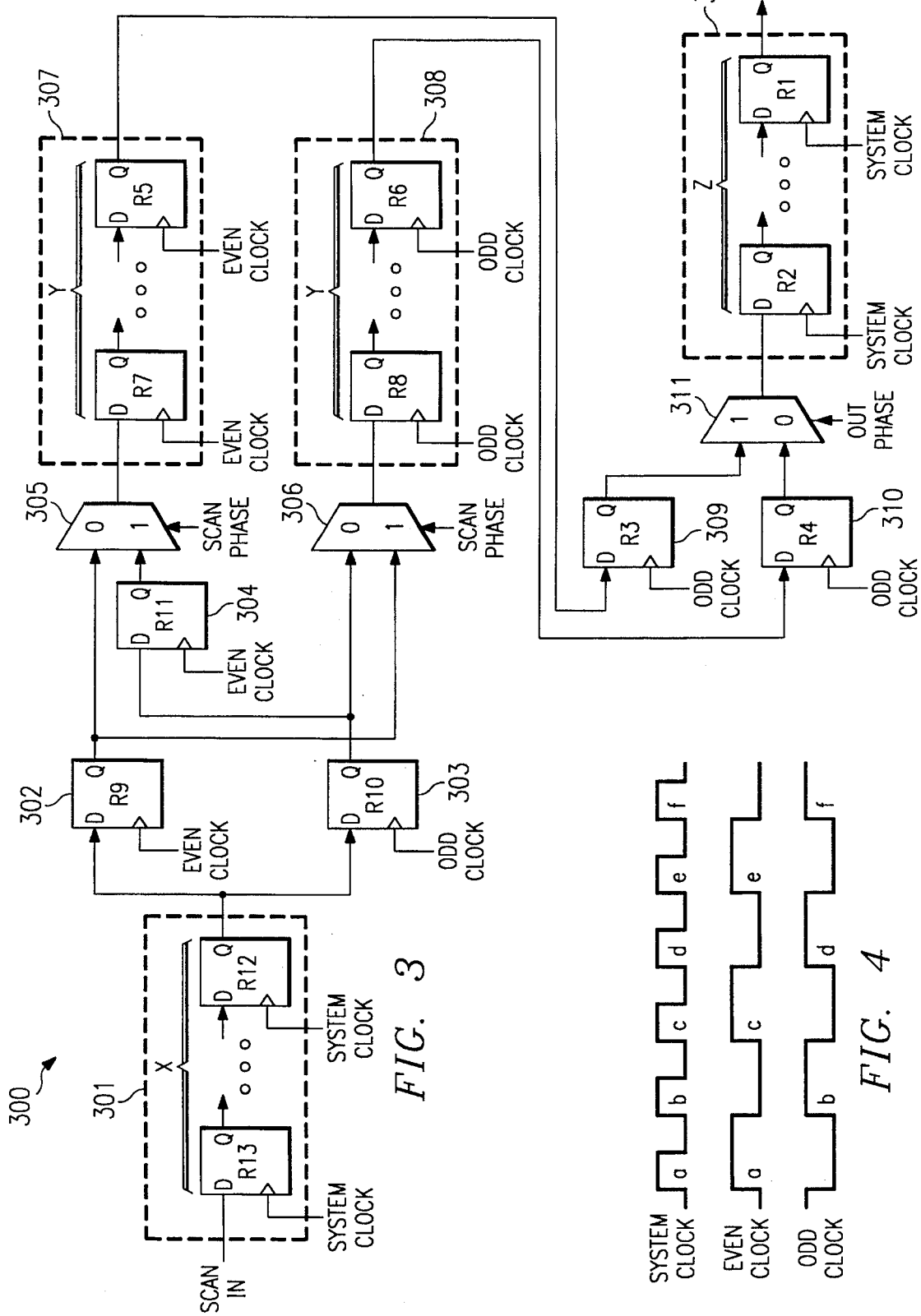

SCANNING, CIRCUITS, SYSTEMS AND METHODS

TECHNICAL FIELD OF THE INVENTION

The present invention relates in general to digital processing systems and in particular to scanning circuits, systems and methods.

BACKGROUND OF THE INVENTION

Many high performance computing systems include a scan operating mode for use in system initialization, error diagnosis and error reporting. During such a scan mode, all the storage elements, such as the pipeline registers and programmable delays, of a given section of circuitry are coupled together, into a scan loop. Typically, the loop is established using multiplexers operable during the normal operating mode to maintain the interconnection of storage and logic elements required for normal processing and during the scan mode switch to connect the storage elements directly together in a loop to the exclusion of the logic elements. Once the scan loop is established during the scan mode, a scan serial pattern of data can be clocked through the loop such that each storage element can be set to a logic one or a logic zero as desired. It should be noted that these scan loops can vary in size and complexity depending on the application; some scan loops may only consist of a few storage elements while other scan loops may consist of a thousand or more storage elements.

The ability to set each storage element in the scan loop to a given logic state has several important advantages. For example, by using the scan mode during system initialization, the registers and variable delay components in the loop can be set to their initial values. Further, during system diagnosis, a test data pattern can be clocked into the storage elements of the scan loop during the scan mode. The system is then reconfigured for the normal processing mode and the test data clocked from storage element to storage element through the intervening logic circuitry. After the normal mode clocking, the shifted data can then be read out by returning to the scan mode and then tested to determine where any errors, if any, are occurring. Finally, the scan mode can be used for error reporting. In this case, the scan loop or a subset of the scan loop is used to hold data when an error is detected until the data can be scanned out by a controller.

Many times a substantial problem arises when scan loops are being designed from storage elements of differing maximum operating speeds. This situation may occur for example when the various storage elements to be included in a given scan loop have been fabricated from more that one fabrication technology (i.e., ECL, TTL, CMOS, BiCMOS). At least two techniques have been used in the prior art to handle such mismatches in operating performance. In the first technique, in order to maintain proper data flow through the slowest elements, a single clock with a clock speed no greater than the maximum allowable clock speed for the slowest elements is used to drive all the elements of the loop. This method has the substantial disadvantage of slowing down the entire scan loop. Further, if the clock being used to drive the scan circuit in the scan mode that differs from that being used in the normal processing mode, additional clock generation circuitry is required which further complicates the design. The second prior art approach to driving scan loop elements of varying maximum operating speeds is to use different clocks commensurate with the speed of the different elements. This method also has serious disadvantages. Additional and/or more complicated clock generation is required to generate all the clocks necessary. Further, the overall timing for the scan loop becomes complex.

Thus, the need has arisen for circuits, systems and methods which allow for efficient establishment of scan loops from storage elements of varying maximum clock speeds. Such circuits, systems and methods should eliminate the need for complex clock generation circuitry while at the same time maintaining maximum performance out of the scan loop circuitry. Further, such circuits, systems and methods should be implemented using a minimal number of components and should be applicable to both board and chip level designs.

SUMMARY OF THE INVENTION

According to one embodiment of the present invention, scanning circuitry is provided which includes first input circuitry operable to transfer bits of received data in response to a first clock signal. Second input circuitry is also provided which is operable to transfer the bits of received data in response to a second clock signal. At least one first storage device is included which is operable to transfer bits of data received from the first input circuitry in response to the first clock signal. At least one second storage device is included which is operable to transfer bits of data received from the second input circuitry in response to the second clock signal. First output circuitry transfers bits of data received from the at least one first storage device in response to the second clock signal while second output circuitry is operable to shift bits of data received from the at least one second storage device in response to the second clock signal. A multiplexer is provided which selects between bits of data received from the first output circuitry and bits of data received from the second output circuitry in response to respective first and second states of a control signal.

According to a second embodiment of the invention, a scan loop is provided which includes first scan circuitry comprising a first plurality of storage devices, data clocked through each of the first plurality of storage devices by a system clock. Second scan loop circuitry is also provided which includes first and second parallel input flip-flops each having a data input coupled to an output of the first plurality of storage devices, data being clocked through the first input flip-flop by an even clock derived from the system clock and data clocked through the second input flip-flop in response to an odd clock derived from the system clock. A second plurality of storage devices includes an input coupled to an output of the first input flip-flop, data being clocked through each of the second plurality of devices by the even clock. A third plurality of storage devices includes an input coupled to an output of the second input flip-flop, with data being clocked through each of the third plurality of devices by the odd clock. First and second output flip-flops are also provided as part of the second scan loop circuitry, the first output flip-flop having an input coupled to an output of the second plurality of storage devices and the second flip-flop having an input coupled to an output of the third plurality of storage devices. Data is clocked through the output flip-flops by the odd clock. The second scan loop circuitry further includes a multiplexer having a first input coupled to an output of the first output flip-flop and a second input coupled to an output of the second output flip-flop. The multiplexer selectively passes data received at the first and second inputs in response to a control signal. Finally, third scan loop circuitry is included in the scan loop and includes a fourth plurality of storage devices having an input coupled to an output of the multiplexer of the second scan loop circuitry. Data is clocked through the fourth plurality of storage devices by the system clock.

According to another embodiment of the present invention, a scan loop is provided which includes a first input register shifting bits of received data in response to a first clock signal. A second input register is provided in parallel to the first input register which shifts the bits of received data in response to a second clock signal, the second clock signal being an inverse of the first clock signal. A third register shifts the bits of data received from the second input register in response to the first clock signal. A first multiplexer selects between bits of data output from the first register and bits of data output from the third register. A second multiplexer is provided in parallel to the first multiplexer which selects between bits of data output from the first register and bits of data output from the second register. At least one storage device is provided which shifts bits of data received from the first multiplexer in response to the first clock. At least one second storage device is provided for shifting bits of data received from the second multiplexer in response to the second clock. First and second output registers are also provided, the first output register shifting data output from the at least one first storage device in response to the second clock signal and the second output register shifting data received from the at least one second storage device also in response to the second clock signal. Finally, a third multiplexer selects between data shifted out of the first output register and data shifted out of the second output register.

The principles of the present invention are also embodied in a method of interfacing scan loop circuits of different speeds. Bits of data are received from first high speed scan loop circuitry at the inputs of first and second parallel input registers. The bits of data received at the inputs of the first input register are shifted to an input of at least one first storage device in response to a first clock signal. The bits of data received at the input of the second input register are shifted to an input of at least one second storage device in response to a second clock signal. In turn, the bits of data received at the input of the at least one storage device are shifted to an input of a first output register in response to the first clock signal while the bits of data received at the input of the at least one second storage device are shifted to an input of a second output register in response to the second clock signal. The bits of data received at the input of the first output register are then shifted to an output of the first register in response to the second clock signal. Further, the bits of data received at the input of the second output register are shifted to an output of the second output register also in response to the second clock signal. Alternately, the bits of data at the outputs of the first and second registers are output to second high speed scan loop circuitry in response to respective first and second states of a control signal.

Scan loop circuitry, systems, and methods embodying the principles of the present invention have substantial advantages over the prior art. In particular, such circuits, systems, and methods eliminate the need for complex clock generation circuitry when scan loops having components of varying speeds are being employed. At the same time, the principles of the present invention allow for the maintenance of maximum performance from the entire scan loop circuit or system. Additionally, the principles of the present invention provide for such improved scan loop circuits and systems to be implemented using a minimal number of components at both the board and chip design levels especially since the novel clocking scheme is identical in both the normal processing and the scan mode.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is an electrical schematic diagram of scan loop circuitry constructed in accordance with one embodiment of the present invention; and FIG. 4 is a diagram illustrating the timing relationship between selected cycles of the system, even, and odd signals driving the scan circuitry depicted in FIG. 3.

DETAILED DESCRIPTION OF THE INVENTION

The principles of the present invention and their advantages are best understood by referring to the illustrated embodiment depicted in FIGS. 1–4 of the drawings, in which like numbers designate like parts.

Figure 1:
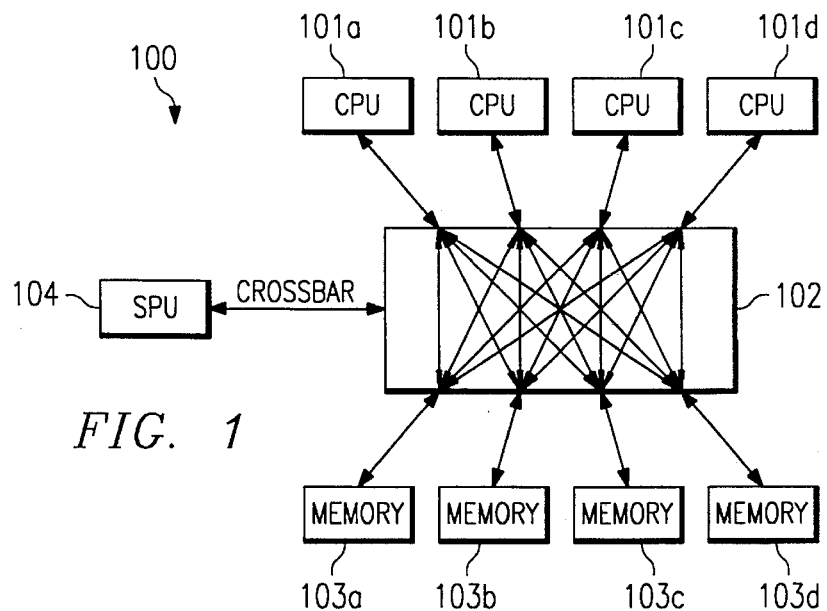
FIG. 1 is a top level functional block diagram of a data processing system embodying the principles of the present invention.

FIG. 1 is a functional block diagram of a processing system 100 according to one embodiment of the present invention. Processing system 100 includes a series of parallel central processing units (CPUs) 101a–101d, a crossbar 102, a series of parallel memory units 103a–103d, and a service processor (SPU) 104. In the illustrated embodiment, each central processing unit 101 is a vector processor. Crossbar 102 allows for the selective interconnection of a given one of the central processing units 101 with a given one of the memory units 103. In the illustrated embodiment, crossbar 102 is memory address selective, and each memory unit 103 accommodates a different address range for the storage and retrieval of data. If a given CPU 101 requires the performance of a memory operation, that CPU 101 provides instructions designating a desired operating address space and crossbar 102 analyzes the instructions from the given CPU 101 and then controls the transfer of data to and from the corresponding memory unit 103. Service processor 104 handles such functions as system initialization and fault detection/isolation.

In the illustrated embodiment, a given CPU 101 accesses a corresponding memory unit 103 by transmitting a memory request to crossbar 102. Crossbar 102 then issues memory request control signals, along with clocks, and clock control signals, to the memory units 103. A memory request from the crossbar 102 to the memory units 103 in the illustrated embodiment includes twenty-seven address bits, five bank select bits, a crossbar request bit along with its parity bit, two request type bits, eight zone bits, 64 bits of write data, eight write data parity bits and four control parity bits.

Two bits of the address bits select the memory unit 103 servicing the memory request. The bank select bits designate the data card which will be servicing the memory request. The address bits output from crossbar 102 are also used by the memory board control circuitry (discussed below) of the selected memory unit 103 to generate the required row and column addresses required by the dynamic random access memory devices on the data cards of the selected memory unit 103 (also discussed further below). The crossbar request bit indicates that a memory request is being is being issued by crossbar 102 during the current clock cycle. The request type bits indicate whether the request is for a refresh, read, write or read-modify-write operation. The zone bits are used to define a byte insertion mask for read-modify-write operations and some write operations. In other words, each zone bit designates one byte of the sixty-four bits of data for purposes of writing into memory on a byte by byte basis; all combinations of the zone bits may be used during a read-modify-write and some combinations may be used during a write. One write data parity bit is provided with each of the eight bytes of write data to insure that each byte has an odd parity (giving the overall 8-byte word an even parity). One bit of the control parity bits sets the parity of the eight zone bits and the two request type combined. Two other control parity bits are each used to set the parity of a respective thirteen bits of the twenty-six address bits. One remaining control parity bit is used to set the parity of the bank select bits.

Figure 2:
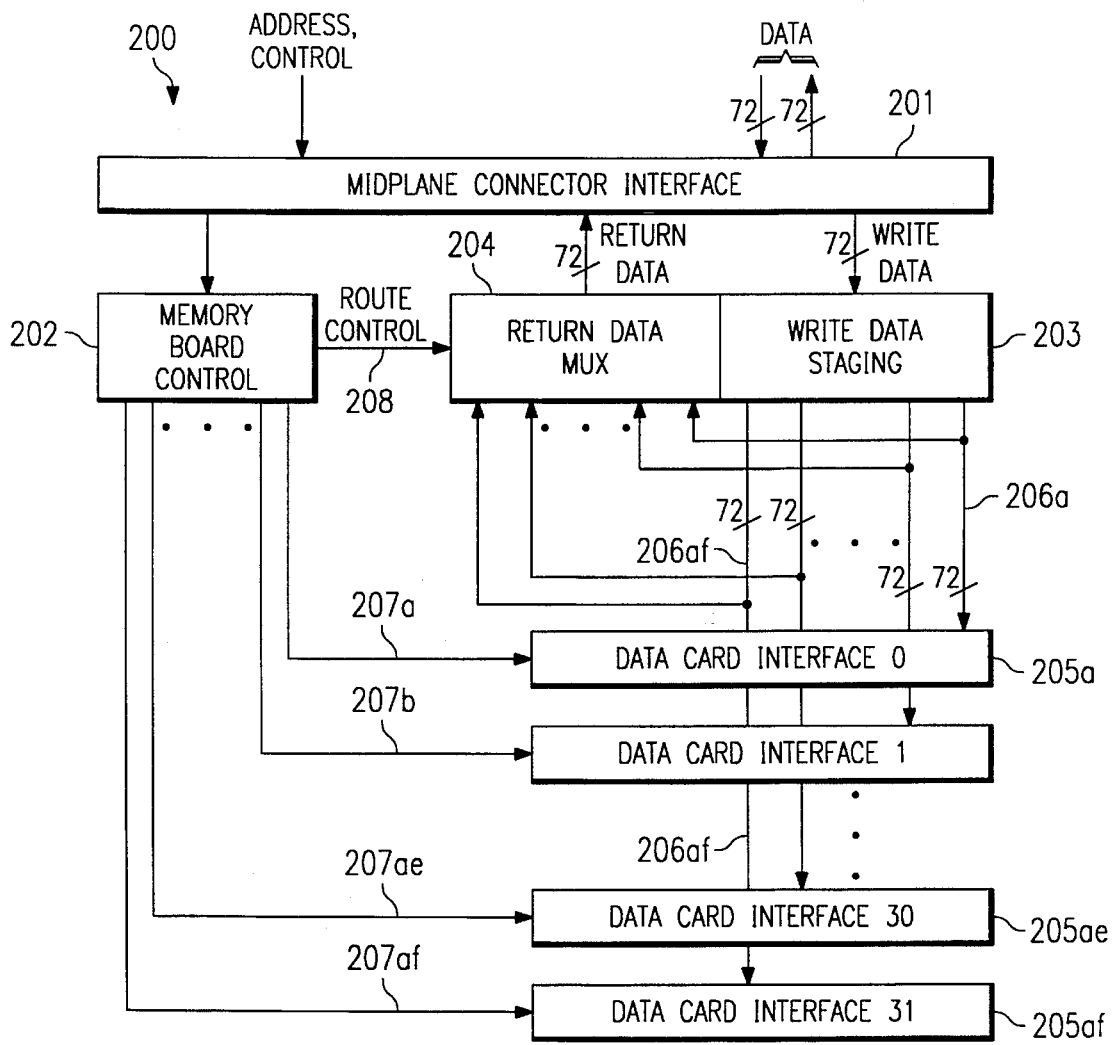
FIG. 2 is a functional block diagram of the motherboard of a selected one of the memory units depicted in FIG. 2.

FIG. 2 is a detailed functional block diagram of the memory board (motherboard) 200 a selected one of the memory units 103a–103d. Memory board 200 includes a midplane connector interface 201 for receiving data, addresses, and control signals from crossbar 102. In the illustrated embodiment, data is received as 72-bit words which are composed of eight 8-bit bytes data and eight corresponding parity bits (one parity bit per byte of data). Address and control signals from crossbar 102 are routed to memory board control circuitry 202 via midplane connector interface 201. Data being routed from and to crossbar 102 through midplane connector 201 are controlled by write staging circuitry 203 and return data multiplexing 204, respectively. Each memory board 200 also includes thirty-two (32) interface units 205 for receiving data cards (daughter boards or cards). Each data card interface 205 is coupled to write data staging circuitry 203 and read data multiplexing circuitry 204 via a respective 72-bit bidirectional bus 206. Thus, in the illustrated embodiment where thirty-two data card interfaces 205 (and correspondingly thirty-two data cards) are employed, there are accordingly thirty-two 72-bit bidirectional buses 206a–206af (a total of 2304 separate lines).

In the illustrated embodiment, write data staging circuitry 203 and return data multiplexing circuitry 204 are together constructed by a series of gate arrays. These gate arrays act in essence like very large demultiplexers capable of handling 72 lines of input and 2304 lines of output, in the case of write staging circuitry 203, and 2304 input lines and 72 output lines in the case of return data multiplexing circuitry 204. Also, in the illustrated embodiment, memory board control circuitry 202 is constructed of thirty-two individual controllers, each one dedicated to a corresponding data card interface 205 through a corresponding bus 207a–207af.

Memory board control circuitry 202 is coupled to return data multiplexing circuitry 204 and write data staging circuitry 203 via a bus 208. Memory board control circuitry 202 handles data requests from a given CPU 101 as directed via crossbar 102. Memory board controller 202 then provides the appropriate addresses and control signals to the selected memory card 205 to perform a write into the associated data card through the associated data card interface 205 using write data staging circuitry 203, a read from the selected memory card through the corresponding data card interface 205 using return data multiplexing circuitry 204, or a read-modify-write.

Referring next to FIG. 3, a scan circuit (loop) embodying the principles of the present invention is shown generally at 300. In the illustrated embodiment, scan circuitry 300 is replicated within each chip comprising write data staging circuitry 203 and return data multiplexer 204 for establishment of scan loops during system initialization and test modes. For clarity and brevity, in FIG. 3 it is assumed that the system is configured in a scan mode such that the elements making up circuitry 300 have already been interconnected into a loop. Scan circuit 300 includes a first set 301 of serial clocked storage elements (devices). Depending on the size of the scan loop, the number of storage elements 301, represented in FIG. 3 by the variable x, may vary from 1 to 1,000 or more. In the illustrated embodiment, storage elements 301 are depicted as D-type flip-flops, however, in alternate embodiments, other types of storage elements, such as variable (programmable) delay lines or other types of flip-flops or registers, may be used to construct storage elements 301, either in whole or in part. Further, in a preferred embodiment, storage elements 301 are high speed devices fabricated using emitter coupled logic (ECL). Bits of scan data, received in the illustrated embodiment from SPU 104 at the input SCAN IN, are shifted through each element of storage elements 301 by the system clock, a profile of which is shown in FIG. 4.

The output of the last storage element of the first set of storage elements 301 (i.e. the $x^{th}$ storage element) drives the data inputs of a pair of input D-type flip-flops or registers 302 and 303. In the illustrated embodiment, flip-flop 302 is clocked by an "even clock" while flip-flop 303 is driven by the "odd clock." In the illustrated embodiment, flip-flops 302 and 303 are also D-type flip-flops although other clocked registers or flip-flops may be used in other embodiments. Profiles of the "even clock" and "odd clock" and their relationship with the system clock are also depicted in FIG. 4. As illustrated in FIG. 4, the odd and even clocks in the preferred embodiments are each a divide by two of the system clock (i.e., having twice the period and one-half of the frequency of the system clock). In essence, the illustrated even and odd clocks are inverses of each other (i.e., one hundred and eighty degrees out of phase from each other).

The data output of flip-flop 302 is coupled in parallel to the "0" input of a first two to one multiplexer 305 and the "1" input of a second two to one multiplexer 306. The data output of flip-flop 303 is coupled in parallel to the data input of a third D-type flip-flop 304 and the "0" input to multiplexer 306. The output of flip-flop 304, which is also clocked by the even clock, is coupled to the "1" input of multiplexer 305. The data appearing at the inputs of multiplexers 305 and 306 is selected by the control signal SCAN PHASE with the logic 0 state of scan phase selecting the data appearing at "0" inputs to multiplexers 305 and 306 and the logic 1 state of control signal scan phase selecting data appearing at the "1" inputs to multiplexers 305 and 306. Control signal SCAN PHASE is generated locally, preferably on the same chip.

The output of multiplexer 305 drives a set 307 of even serial storage elements. Depending on the size of the scan loop, the number of storage elements in set 307, represented in FIG. 3 by the variable y, may vary from 1 to 1,000 or more. In the illustrated embodiment, storage elements 307 are D-type flip-flops, however, in alternate embodiments, even storage elements 307 may include other types of registers or clocked storage elements, such as variable (programmable) delay lines or other types of flip-flops. Each of the even storage elements 307 are clocked by the even clock signal of FIG. 4.

The data output from multiplexer 306 drives a set 308 of serial "odd" storage elements. In the preferred embodiment, the number of odd storage elements 308, also represented in FIG. 3 by the variable y, is equal to the number of even storage elements of set 307. In the illustrated embodiment, the odd storage elements 308 are also D-type flip-flops, however, as in the case of even storage elements 307, other types of clocked storage elements may be used, in whole or in part, in alternate embodiments.

The output of the last even storage element 307 is coupled to the data input of D-type output flip-flop or register 309 which is clocked by the odd clock shown in FIG. 4. The output of the last flip-flop of the odd storage element set 308 is coupled to the data input of a second output D-type flip-flop or register 310, which is also clocked by the odd clock. In turn, the output of flip-flop 309 is coupled to the "1" input of multiplexer 311 and the output of flip-flop 310 is coupled to the "0" input of multiplexer 311. The data output from flip-flop 309 appearing at the "1" input to multiplexer 311 is selected on the high (logic 1) state of control signal OUT PHASE and data output from flip-flop 310 and appearing at the "0" input of multiplexer 311 is selected with each low (logic 0) period of control signal OUT PHASE. Control signal OUT PHASE is generated through an exclusive-OR operation on control signal SCAN PHASE and the even clock. The operation of multiplexer 311 and control signal OUT PHASE will be discussed in detail below.

In the illustrated embodiment, flip-flops 302–304, multiplexers 305 and 306, even storage elements 307, odd storage elements 308, flip-flops 309–310 and multiplexer 311 are all fabricated using a technology of a lower speed than that used in the fabrication of storage elements 301. In the preferred embodiment where storage elements 301 are fabricated from an emitter-coupled logic technology (ECL), devices 302–311 are fabricated using a BiCMOS fabrication technology.

The output of multiplexer 311 is coupled to the data input of a set 312 of storage elements. The number of storage elements 312, represented by the variable z in FIG. 3, may vary from application to application from 1 element to 1,000 or more elements. In the illustrated embodiment, the storage elements of set 312 are represented as D-type flip-flops, however, in alternate embodiments, other clocked storage elements such as variable delay lines may be used to construct storage element set 312, either in whole or in part. Further, in the illustrated embodiment, storage elements 312 are fabricated using a fabrication technology faster than that used to construct flip-flops 302–304, multiplexers 305 and 306, odd storage elements 308, even storage elements 307, flip-flops 309–310 and multiplexer 311. In the preferred embodiment storage elements 312 are fabricated using an emitter coupled logic (ECL) technology. The output of the last storage element of set 312 is coupled back to SPU 104 through cross bar 102 to complete the scan loop.

The operation of scan loop 300 embodying the principles of the present invention is most easily described through an example in which x, the number of storage elements comprising storage element set 301, y, the number of storage elements in even and odd storage element sets 307 and 308, and y, the number of storage elements in storage element set 312, are all equal to 2. It should be noted that while x, y and z have been selected to be 2 for brevity and clarity in explaining the operation of circuitry 300, but that, as discussed above, in alternate embodiments x, y and z may number into the thousands. In these alternate embodiments, the operation is essentially the same, but the timing involves a correspondingly larger number of clock cycles for a given bit to completely pass through scan circuitry 300.

For purposes of the present example, each register or flip-flop (register) depicted in FIG. 3 has been designated with a label between R1 and R13 for purposes of identification in the present example. Table 1 lists an initial value, designated by a lower case letter, that each register (flip-flop) has been set to at initialization. These values may be set for example by clocking in a data pattern through the input SCAN IN. In alternate embodiments, each flip-flop or register 300 may be directly set using set/reset control inputs associated with each register or storage element (not shown). Each initial value designated in the second column of TABLE 1 represents either a logical 1 or a logical 0, depending on the application of scan loop 300. Further, it should be noted that the designator letters in the R13 and R12 columns in Table 1 are sequential to illustrate that a continuing sequence of bits are received at the SCAN IN input and pipelined through registers R13 and R12 during scanning.

TABLE 1

| Initial Register Values | |
|---|---|
| Register | Initial Value |
| R1 | a |
| R2 | b |
| R3 | x1 |
| R4 | x2 |
| R5 | c |
| R6 | d |
| R7 | e |
| R8 | f |
| R9 | y1 |
| R10 | y2 |
| R11 | y3 |
| R12 | g |
| R13 | h |

Scan circuitry 300 operates in two modes, depending on which one of the odd or even clocks scanning begins on. In the first mode, when circuitry 300 begins scanning on an even clock cycle, control signal SCAN PHASE is set to a logic 0 and remains in that state for the duration of the scan operation. Control signal OUT PHASE, being derived from an Exclusive-OR operation of SCAN PHASE and the even clock, transitions to a "high" or "logic 1" state with each "high" or "logic 1" cycle of the even clock. The timing for 12 system clock cycles in the first operating mode is shown in tabular form in Table 2:

TABLE 2

| system clock | Mode #1 Scan Operation | | | | | | | | | | | | |
|---|---|---|---|---|---|---|---|---|---|---|---|---|---|
| | Register | | | | | | | | | | | | |
| | R13 | R12 | R9 | R10 | R11 | R8 | R6 | R7 | R5 | R4 | R3 | R2 | R1 |
| Initial | h | g | y1 | y2 | y3 | f | d | e | c | x2 | x1 | b | a |
| 1* | i | h | g | y2 | — | f | d | y1 | e | x2 | x1 | x2 | b |

TABLE 2-continued

Mode #1 Scan Operation

| system clock | R13 | R12 | R9 | R10 | R11 | R8 | R6 | R7 | R5 | R4 | R3 | R2 | R1 |
|---|---|---|---|---|---|---|---|---|---|---|---|---|---|
| 2    | j | i | g | h | — | y2 | f  | y1 | e | d | e  | x1 | x2 |
| 3*   | k | j | i | h | — | y2 | f  | g  | y1| d | e  | d  | x1 = c** |
| 4    | l | k | i | j | — | h  | y2 | g  | y1| f | y1 | e  | d |
| 5*   | m | l | k | j | — | h  | y2 | i  | g | f | y1 | f  | e |
| 6    | n | m | k | l | — | j  | h  | i  | g | y2| g  | y1 | f |
| 7*   | o | n | m | l | — | j  | h  | k  | i | y2| g  | y2 | y1 |
| 8    | p | o | m | n | — | l  | j  | k  | i | h | i  | g  | y2 |
| 9*   | q | p | o | n | — | l  | j  | m  | k | h | i  | h  | g |
| 10   | r | q | o | p | — | n  | l  | m  | k | j | k  | i  | h |
| 11*  | s | r | q | p | — | n  | l  | o  | m | j | k  | j  | i |
| 12   | t | s | q | r | — | p  | n  | o  | m | l | m  | k  | j |

In Table 2 the even clock cycles have been indicated with an asterisk.

On the rising edge of "even" Clock cycle 1, the initial value h set into the register R13 is shifted into register R12 while a new bit i is clocked into register R13 from input SCAN IN. At the same time, the initial value g set into register R12 is clocked to the output of register R9 by the corresponding rising edge of the even clock. In Mode 1, where SCAN PHASE set to a logic zero, the output of register R9 is coupled through multiplexer 305 to the input of register R7 such that the initial value y1 set into register R9 is clocked into register R7 with the rising edge of the corresponding even clock. Similarly, the initial value e set into register R7 is clocked into register R5 with the corresponding even clock.

On the rising edge of system clock cycle 1, the initial value x2 set into register R4 is clocked into register R2 just prior to control signal OUT PHASE transitioning to a logic one with the rising edge of the even clock to switch selected input of multiplexer 311 from the "0" input to the "1" input. Simultaneously, the initial value b set into register R2 is shifted to the output of R1 as the SCAN OUT data.

In Mode 1, the rising edge of system clock period 2 corresponds to the first rising edge of the odd clock of the scan operation. With the rising edge of clock period 2, a new bit j is clocked into R13 and the bit i, previously clocked into register R13 with system clock cycle 1, is pipelined into register R12. Concurrently, the value h being held in register R12 is shifted into register R10 with the rising edge of the corresponding odd clock. Since control signal SCAN PHASE remains low during Mode 1, the initial value y2 set into register R10, which was not clocked during the even clock cycle discussed above, is clocked into register R8 through multiplexer 306. The values d and f which were initially set into registers R6 and R8 respectively and which were also was not pipelined during the even clock cycle, are now transferred with the corresponding odd clock 2 to registers R4 and R6 respectively.

Just prior to control signal OUT PHASE transitioning from a logic 1 to a logic 0 with the falling edge of the even clock thereby switching the selected input of multiplexer 311 the "0" input to the "1" input, the initial value x1 set into register R3 is clocked by system clock cycle 2 into register R2. The value x2 clocked into register R2 after the clock cycle 1 is shifted into register R1 and becomes the output signal SCAN OUT.

The scan operation continues in Mode 1, following the same clocking sequences discussed above in regards to system clock cycles 1 and 2, until the complete scan pattern has been shifted through scan loop 300. The remaining ten clock cycles illustrated in Table 2 are provided to demonstrate the data flow immediately following clock system cycles 1 and 2. It should be noted that with each new clock cycle of the odd and even clocks, the bits of the scan pattern are pipelined forward one register through each of the corresponding two parallel data paths.

Table 3 illustrates the second mode of operation (Mode 2) of scan circuitry 300 in which scanning commences on a period of the odd clock. In Table 3, the rising edge of system clock cycle 1 corresponds to the rising edge of an odd clock cycle and the rising edge of system clock cycle 2 corresponds to the rising edge of the even clock cycle. In this case, control signal SCAN PHASE is set to a logic 1 such that data presented at the "1" inputs to multiplexers 305 and 306 is selected. Further, since control signal SCAN PHASE is set to a logic 1, control signal OUT PHASE now transitions "high" with the falling edges of the even clock.

TABLE 3

Mode #2 Scan Operation

| system clock | R13 | R12 | R9 | R10 | R11 | R8 | R6 | R7 | R5 | R4 | R3 | R2 | R1 |
|---|---|---|---|---|---|---|---|---|---|---|---|---|---|
| Initial | h | g | y1 | y2 | y3 | f  | d  | e  | c  | x2 | x1 | b  | a |
| 1       | i | h | y1 | g  | y3 | y1 | f  | e  | c  | d  | c  | x2 | b |
| 2*      | j | i | h  | g  | g  | y1 | f  | y3 | e  | d  | c  | c  | x2 |
| 3       | k | j | h  | i  | g  | h  | y1 | y3 | e  | f  | e  | d  | c |
| 4*      | l | k | j  | i  | i  | h  | y1 | g  | y3 | f  | e  | e  | d |
| 5       | m | l | j  | k  | i  | j  | h  | g  | y3 | y1 | y3 | f  | e |
| 6*      | n | m | l  | k  | k  | j  | h  | i  | g  | y1 | y3 | y3 | f |

TABLE 3-continued

| system clock | Mode #2 Scan Operation Register | | | | | | | | | | | | |
|---|---|---|---|---|---|---|---|---|---|---|---|---|
| | R13 | R12 | R9 | R10 | R11 | R8 | R6 | R7 | R5 | R4 | R3 | R2 | R1 |
| 7 | o | n | l | m | k | l | j | i | g | h | g | y1 | y3 |
| 8* | p | o | n | m | m | l | j | k | i | h | g | g | y1 |
| 9 | q | p | n | o | m | n | l | k | i | j | i | h | g |
| 10* | r | q | p | o | o | n | l | m | k | j | i | i | h |
| 11 | s | r | p | q | o | p | n | m | k | l | k | j | i |
| 12* | t | s | r | q | q | p | n | o | m | l | k | k | j |

In Table 3 the even clock cycles have been indicated with an asterisk.

On the rising edge of Clock 1, the initial value h set into the register R13 is shifted into register R12 while a new bit i from input SCAN IN is clocked into register R13. At the same time, the initial value g set into register R12 is clocked to the output of register R10 by the corresponding rising edge of the odd clock. In Mode 2, where SCAN PHASE set to a logic 1, the output of register R9 is coupled by multiplexer 306 to the input of register R8 such that the initial value y1 set into register R9 is clocked into register R8 with the rising edge of the corresponding odd clock. Similarly, the initial value f set into register R8 is clocked into register R6 with the odd clock.

On the rising edge of system clock cycle 1, the initial value x2 set into register R4 is clocked into register R2 just prior to control signal OUT PHASE transitioning to a logic one with the falling edge of the even clock thereby switching the selected input of multiplexer 311 from the "0" input to the "1" input. Simultaneously, the initial value b set into register R2 is shifted to the output of R1 as the SCAN OUT data.

In Mode 2, the rising edge of system clock cycle 2 corresponds to the first rising edge of the even clock of the scan operation. With the rising edge of clock cycle 2, a new bit j is clocked into register R13 and the bit i, previously clocked into register R13 with odd system clock cycle 1, is pipelined into register R12. Concurrently, the value h being held in register R12 is clocked into register R9 with the rising edge of the corresponding even clock. The value g which was clocked into register R10 with the odd clock in Mode 2 is now clocked into register R11 with the even clock. On the same rising edge of the even clock the initial value y3 being held in register R11 is clocked into register R7 through multiplexer 305. The initial value set e into register R7 is also clocked by the rising edge of the even clock into register R5.

Just prior to control signal OUT PHASE transitioning from a logic 1 to a logic 0 with the rising edge of the even clock thereby switching the selected input of multiplexer from the "1" to the "0" input, the value c which was clocked into register R3 during the previous clock cycle is clocked by the rising edge of period 2 of the system clock into register R2. The value X2 held in register R2 after the odd clock cycle 1 is shifted into register R1 and becomes the output signal SCAN OUT.

As in the case of Mode 1, the scan operation continues in Mode 2, following the same clocking sequence of system clock cycles 1 and 2, until the complete scan pattern has been shifted through scan loop 300. Again it should be noted, that with each new clock cycle of the odd and even clocks, the bits of the scan pattern are pipelined forward one register through each of the corresponding two parallel data paths. The remaining ten clock cycles illustrated in Table 3 are provided to demonstrate the data flow immediately following clock system cycles 1 and 2.

In sum, the principles of the present invention provide for the construction or establishment of scan loops which contain storage elements of differing speeds. Scan loops embodying the principles of the present invention advantageously split the bits of data output from the high speed storage elements 301 of the scan loop, being clocked by the system clock, between a pair of parallel paths (comprising registers/storage elements 302, 307, and 309 and 303, 308, and 310, respectively) clocked at a lower clock rate (i.e., by the odd and even clocks). Any slower storage elements in the scan loop can be disposed along one of the parallel paths without the risk of exceeding the maximum clock rate for those elements. The data output from the parallel paths may then recombined and reclocked with the system clock for transfer through the remainder of the scan loop.

What is claimed is:

1. Scanning circuitry comprising:
    first input circuitry operable to transfer bits of received data in response to a first clock signal;
    second input circuitry operable to transfer said bits of received data in response to a second clock signal;
    at least one first storage device operable to transfer bits of data received from said first input circuitry in response to said first clock signal;
    at least one second storage device operable to transfer bits of data received from said second input circuitry in response to said second clock signal;
    first and second output circuitry, said first output circuitry operable to transfer bits of data received from said at least one first storage device in response to said second clock signal and said second output circuitry shifting bits of data received from said at least one second storage device in response to said second clock signal; and
    a multiplexer selecting between bits of data received from said first output circuitry and bits of data received from said second output circuitry in response to respective first and second states of a control signal.

2. The scanning circuitry of claim 1 wherein said first and second input circuitries comprise flip-flops.

3. The scanning circuitry of claim 1 wherein said at least one first storage device comprises at least one flip-flop.

4. The scanning circuitry of claim 1 wherein said at least one first storage device comprises at least one programmable delay device.

5. The scanning circuitry of claim 1 wherein said at least one second storage device comprises at least one flip-flop.

6. The scanning circuitry of claim 1 wherein said at least one second storage device comprises at least one programmable delay device.

7. The scanning circuitry of claim 1 wherein said first and second output circuitries comprise flip-flops.

8. The scanning circuitry of claim 1 wherein said second clock is an inverse of said first clock.

9. The scanning circuitry of claim 1 wherein said first and second clocks have equal periods.

10. A scan loop comprising:
   first scan loop circuitry comprising a first plurality of storage devices, data clocked through each of said first plurality of storage devices by a system clock;
   second scan loop circuitry comprising:
      first and second parallel input flip-flops each having a data input coupled to an output of said first plurality of storage devices, data clocked through said first input flip-flop by an even clock derived from said system clock and data clocked through said second input flip-flop in response to an odd clock derived from said system clock;
      a second plurality of storage devices having an input coupled to an output of said first input flip-flop, data clocked through each of said second plurality of devices by said even clock;
      a third plurality of storage devices having an input coupled to an output of said second input flip-flop, data clocked through each of said third plurality of devices by said odd clock;
      first and second output flip-flops, said first output flip-flop having an input coupled to an output of said second plurality of devices and second flip-flop having an input coupled to an output of said third plurality of devices, data clocked through said output flip-flops by said odd clock;
      a multiplexer having a first input coupled to an output of said first output flip-flop and a second input coupled to an output of said second output flip-flop, said multiplexer selectively passing data received at said first and second inputs in response to a control signal; and
   third scan loop circuitry comprising a fourth plurality of storage devices having an input coupled to an output of said multiplexer, data clocked through said fourth plurality of storage devices by said system clock.

11. The scan loop of claim 10 wherein said even clock has a period of twice a period of said system clock.

12. The scan loop of claim 10 wherein said odd clock comprises an inverted said even clock.

13. The scan loop of claim 10 wherein said first and third scan loop circuitries comprise high speed circuits.

14. The scan loop of claim 13 wherein said second scan circuitries comprises devices of a lower speed than said first and second scan loop circuitries.

15. The scan loop of claim 10 wherein said first and second scan circuitries comprise emitter-coupled logic devices.

16. The scan loop of claim 10 wherein said second scan circuitry comprises BiCMOS devices.

17. The scan loop of claim 10 wherein said control signal toggles with said even clock.

18. A scan loop comprising:
   a first input register shifting bits of received data in response to a first clock signal;
   a second input register parallel to said first input register shifting said bits of received data in response to a second clock signal, said second clock signal being an inverse of said first clock signal;
   a third register for shifting bits of data received from said second input register in response to said first clock signal;
   a first multiplexer for selecting between bits of data output from said first register and bits of data output from said third register;
   a second multiplexer for selecting between bits of data output from said first register and bits of data output from said second register;
   at least one first storage device for shifting bits of data received from said first multiplexer in response to the first clock;
   at least one second storage device shifting bits of data received from said second multiplexer in response to the second clock;
   first and second output registers, said first output register shifting data output from said at least one first storage device in response to said second clock signal and said second output register shifting data received from said at least one second storage device in response to said second clock signal; and
   a third multiplexer selecting between data shifted out of said first output register and data shifted out of said second output register.

19. The scan loop of claim 18 wherein:
   said first multiplexer selects said bits output from said first input register in response to a first state of a control signal and said bits output from said third register in response to a second state of said control signal; and
   said second multiplexer selects said bits output from said second input register in response to said first state of said control signal and said bits output from said first input register in response to said second state of said control signal.

20. The scan loop of claim 18 wherein said first state of said control signal corresponds to a scan operation starting on a period of said first clock and said second state of said control signal corresponds to a scan operation starting on a period of said second control signal.

21. The scan loop of claim 18 wherein said first and second clocks have equal periods.

22. The scan loop of claim 18 said first and second clocks comprise square waves, said second clock being an inverted said first clock.

23. The scan loop of claim 18 wherein said third multiplexer is operable to select between said data shifted out of said first output register and data shifted out of said second output register in response to a control signal, said control signal toggling with said first clock.

24. Scan circuitry comprising:
   first and second storage devices each having a data input for receiving input data, input data received at said input of said first device clocked to an output of said first device by a first clock and input data received at said input of said second device clocked to an output of said second device by a second clock;
   a third storage device having a data input coupled to said output of said second device, data received at said input of said third device clocked to an output of said third device by said first clock;
   a first multiplexer having a first input coupled to said output of said first device and a second input coupled to said output of said third device, data received at said first input passed to an output of said first multiplexer in response to a first state of a first control signal and data received at said second input passed to said output of said first multiplexer in response to a second state of said first control signal;

a second multiplexer having a first input coupled to said output of said second device and a second input coupled to said output of said first device, data received at said first input passed to an output of said second multiplexer in response to said first state of said first control signal and data received at said second input passed to said output of said second multiplexer in response to said second state of said first control signal;

at least one fourth storage device coupled to said output of said first multiplexer and clocked by said first clock;

at least one fifth storage device coupled to said output of said second multiplexer and clocked by said second clock;

a sixth and seventh storage devices clocked by said second clock, an input of said sixth device coupled to an output of said at least one fourth storage device and an input of said seventh storage device coupled to an output of said at least one fifth storage device; and a third multiplexer having a first input coupled to an output of said sixth device and a second input coupled to an output of said seventh device, data received at said first input of said third multiplexer passed to an output of said third multiplexer in response to a first state of a second control signal and data received at said second input of said third multiplexer passed to an output of said third multiplexer in response to a second state of said second control signal.

25. The scan circuitry of claim 24 wherein said data received at said inputs to said first and second storage devices is clocked with a system clock, said first and second clocks derived from said system clock.

26. The scan circuitry of claim 25 wherein a period of said first and second clocks is a multiple of a period of said system clock.

27. The scan circuitry of claim 26 wherein said period of each of said first and second clocks is equal.

28. A method of interfacing scan loop circuits of different speeds comprising the steps of:

receiving bits of data from first high speed scan loop circuitry at the inputs of first and second parallel input registers;

shifting the bits of data received at the input of the first input register to an input of at least one first storage device in response to a first clock signal;

shifting the bits of data received at the input of the second input register to an input of at least one second storage device in response to a second clock signal;

shifting the bits of data received at the input of the at least one first storage device to an input of a first output register in response to the first clock signal;

shifting the bits of data received at the input of the at least one second storage device to an input of a second output register in response to the second clock signal;

shifting the bits of data received at the input of the first output register to an output of the first output register in response to the second clock signal;

shifting bits of data received at the input of the second output register to an output of the second output register in response to the second clock signal;

alternatively passing the bits of data at the output of the first output register and the bits of data at the output of the second output register to second high speed scan loop circuitry in response to respective first and second states of a control signal.

29. The method of claim 28 and further comprising the step of deriving the first and second clock signals from a system clock signal clocking data through said first and second high speed scan loop circuitries.

30. The method of claim 29 wherein said step of deriving comprises a step of dividing down a frequency of the system clock by two.

* * * * *